United States Patent
Clarke et al.

(10) Patent No.: US 7,443,483 B2
(45) Date of Patent: Oct. 28, 2008

(54) SYSTEMS AND METHODS FOR FLUID FLOW CONTROL IN AN IMMERSION LITHOGRAPHY SYSTEM

(75) Inventors: Michael Clarke, Bedford, MA (US); Robert F. McLoughlin, Pelham, NH (US); Marc Laverdiere, Wakefield, MA (US)

(73) Assignee: Entegris, Inc., Chaska, MN (US)

( * ) Notice: Subject to any disclaimer, the term of this patent is extended or adjusted under 35 U.S.C. 154(b) by 224 days.

(21) Appl. No.: 11/502,729

(22) Filed: Aug. 11, 2006

(65) Prior Publication Data

US 2008/0036985 A1     Feb. 14, 2008

(51) Int. Cl.
*G03B 27/52* (2006.01)
*G03B 27/42* (2006.01)

(52) U.S. Cl. .......................................... 355/30; 355/53
(58) Field of Classification Search ............... 355/30, 355/53, 55; 73/37.5; 250/492.1
See application file for complete search history.

(56) References Cited

U.S. PATENT DOCUMENTS

| | | |
|---|---|---|
| 2004/0118184 A1 | 6/2004 | Violette |
| 2005/0018156 A1 | 1/2005 | Mulkens et al. |
| 2005/0048220 A1 | 3/2005 | Mertens et al. |
| 2005/0179877 A1 | 8/2005 | Mulkens et al. |
| 2005/0219481 A1 | 10/2005 | Cox et al. |
| 2005/0219499 A1 | 10/2005 | Zaal et al. |
| 2005/0259233 A1 | 11/2005 | Streefkerk et al. |
| 2005/0259234 A1 | 11/2005 | Hirukawa et al. |
| 2005/0259236 A1 | 11/2005 | Straaijer |
| 2005/0263068 A1 | 12/2005 | Hoogendam et al. |
| 2005/0270506 A1 | 12/2005 | Streefkerk et al. |
| 2006/0072089 A1* | 4/2006 | Eussen et al. ................. 355/53 |

OTHER PUBLICATIONS

International Search Report and Written Opinion mailed Jul. 31, 2008 for International Application No. PCT/US2007/016673.

* cited by examiner

*Primary Examiner*—Peter B Kim
(74) *Attorney, Agent, or Firm*—Sprinkle IP Law Group (57) ABSTRACT

Systems and methods for controlling fluid flow in an immersion lithography system. The system includes a fluid flow path that allows fluid to flow from a source through a fluid retention hood and then a fluid control valve. The system includes a pressure sensing system for determining a pressure drop across the fluid retention hood. The pressure drop across the fluid retention hood changes with the fluid flow rate. A control system receives signals indicating the pressure drop across the fluid retention hood and produces control signals for the fluid control valve. The control signals adjust the fluid flow rate through the fluid control valve to drive the flow rate to a desired rate, thereby driving the sensed pressure drop across the fluid retention hood to a desired pressure drop.

19 Claims, 4 Drawing Sheets

SYSTEMS AND METHODS FOR FLUID FLOW CONTROL IN AN IMMERSION LITHOGRAPHY SYSTEM

TECHNICAL FIELD OF THE INVENTION

Embodiments of the invention generally to fluid flow control, and more particularly to systems and methods for controlling the flow of fluid through a fluid retention hood in an immersion lithography system.

BACKGROUND

There is an increasing demand for computers and other electronic devices that have greater computing power and consume less energy. To meet this demand, advances are constantly being made in computer and other electronics technologies. These advances include the developments, not only in the design of the electronic devices themselves, but also in the processes that are used to manufacture these devices. One such advance in the area of manufacturing processes is referred to as immersion lithography.

Lithography systems are widely used to project an image pattern onto and thereby expose photoresist materials that have been deposited on semiconductor wafers. The photoresist material is exposed in order to create a patterned mask which may then be used to etch a complementary pattern on the surface of the wafer, or to allow dopants to be selectively deposited in the semiconductor material. The lithographic exposure may be repeated many times using various patterns during a particular manufacturing process in order to form the desired electronic components (e.g., transistors, resistors, traces, etc.).

A relatively recent improvement in the area of semiconductor manufacturing is the development of immersion lithography. In immersion lithography, a fluid such as water is placed between the last lens of the lithography system and the surface of the semiconductor wafer. Because the refractive index of the fluid is higher than the refractive index of air (which conventionally fills the space between the last lens and the wafer,) the numerical aperture of the lithography system can be increased. As a result, the lithography system can be used either to print smaller features, or to improve process latitude in comparison to conventional systems.

Immersion lithography is viewed in the in semiconductor manufacturing industry as an enabling technology. In other words, this technology enables other improvements to be made in semiconductor and electronic technologies that would not otherwise be possible. The improvement in the manufacturing process resulting from immersion lithography has delayed and/or eliminated the need to introduce some technologies (e.g., 157 nm lithography) and has at least delayed the need to introduce others (e.g., EUV lithography.) Immersion lithography has shown itself to provide significant benefits to the semiconductor industry, and virtually all leading-edge semiconductor manufacturers are implementing immersion lithography.

While immersion lithography can provide significant advantages to semiconductor manufacturers, it is necessary to closely control a number of factors relating to the use of this technology. For example, conventional immersion lithography systems include means to condition the water that is placed between the lens and the semiconductor wafer. This conditioning may include degassing the water, removing particles, and controlling the temperature of the water, among other things. One of the most critical aspects of the water conditioning is the control of its temperature, as this affects the refractive index of the water, which in turn affects the focus of the lithography system.

Because the water in the gap between the lens and the wafer may be heated from exposures by the light generated in the lithography system, it is necessary to have the water flow through the gap. The flow of water through this gap is typically managed by a flow controller. Conventional flow controllers, however, may have a number of problems that can degrade the images produced by the lithography system. These problems may, for example, include temperature variations in the water which are introduced by heating in the electronics of the flow controllers. These temperature variations can alter the refractive index of the water, as well as causing inaccuracies in the measured flow rate of the water. Another problem is that vibrations created by the flow controllers also cause variations in the refractive index of the water, resulting in degraded imaging by the system. These vibrations are typically generated by movement of parts within the flow control valves. Vibrations may also be generated by operation of a vacuum pump which removes water from the gap between the lens and the wafer. Pulsations in the vacuum generated by the vacuum pump may also cause variations in the flow rate of the water through the retention hood. Still further, if the vacuum pump removes the water from the retention hood too slowly, the water may leak out of the hood, and if the pump removes the water from the retention hood too quickly, bubbles may be introduced into the water in the retention hood.

It would therefore be desirable to provide systems and methods for controlling the flow of water or other fluids through the gap between the last lens and the semiconductor wafer in an immersion lithography system in order to reduce the problems associated with prior art systems that can degrade the effectiveness of the system.

SUMMARY OF THE INVENTION

One or more of the problems outlined above may be solved by the various embodiments of the invention. Broadly speaking, the invention comprises systems and methods for controlling fluid flow in an immersion lithography system. The system includes a fluid flow path that allows fluid to flow from a source through a fluid retention hood and a fluid control valve. The system also includes a pressure sensing system for determining a pressure drop across the fluid retention hood. The magnitude of the pressure drop increases with increased fluid flow and decreases with decreased fluid flow. A control system manages operation of the flow control valve to control the flow of fluid through the fluid retention hood. The control system drives the pressure drop across the fluid retention hood to a desired setpoint which corresponds to a desired flow rate.

One embodiment comprises a system for controlling fluid flow in an immersion lithography system. The immersion lithography system has a fluid retention hood for retaining fluid between the last lens of the system's optics and a semiconductor wafer to be exposed by the system. A pressure sensing unit is configured to sense a pressure drop across the fluid retention hood. A flow control valve is positioned downstream from the fluid retention hood and is controlled by a controller that receives signals from the pressure sensing unit. The controller compares the signals from the pressure sensing unit to a setpoint or upper and lower threshold values to determine whether the pressure drop across the fluid retention hood is above or below a desired pressure drop (hence whether the actual fluid flow through the fluid retention hood is above or below a desired flow rate. The controller then adjusts the fluid flow through the flow control valve to drive the sensed pressure drop across the fluid retention hood to the desired pressure drop.

The pressure sensing unit may include pressure sensors that are both upstream and downstream from the fluid retention hood. Alternatively, the pressure sensing unit may include only a single pressure sensor that is downstream from the fluid retention hood, in which case the pressure drop across the hood is determined by subtracting the sensed downstream pressure from a known pressure at an upstream fluid source. In either case, the controller increases the flow through the flow control valve when the sensed pressure drop is less than the desired pressure drop, and decreases the flow through the flow control valve when the sensed pressure drop is greater than the desired pressure drop. In one embodiment, the upstream end of the fluid flow path (i.e., the fluid source) is maintained at a pressure above atmospheric pressure, while the output of the flow control valve (or downstream end of the fluid flow path) is maintained at atmospheric pressure.

Another embodiment comprises a method for controlling fluid flow in an immersion lithography unit having a fluid retention hood and a fluid flow path therethrough. The method comprises sensing a pressure drop in the fluid flow path across the fluid retention hood, determining whether the sensed pressure drop is equal to a desired pressure drop and controlling a flow control valve positioned in the fluid flow path downstream from the fluid retention hood to drive the sensed pressure drop to the desired pressure drop. The sensing of the pressure drop across the fluid retention hood may consist of sensing fluid pressures upstream and downstream from the fluid retention hood and taking the difference, or sensing only the downstream fluid pressure and taking the difference between this pressure and a known fluid source pressure. Determining whether the sensed pressure drop is equal to a desired pressure drop may be accomplished by comparing a signal corresponding to the sensed pressure drop to a single setpoint, or by comparing the signal to upper and lower thresholds that define an acceptable range of signal values.

Yet another embodiment comprises a software program. The software program may be stored on a medium readable by the control system's data processor, or a more easily transportable medium from which the software can be loaded into the control system. The software contains instructions configured to cause the data processor in the flow control system to perform the method as described above.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION

One or more embodiments of the invention are described below. It should be noted that these and any other embodiments described below are exemplary and are intended to be illustrative of the invention rather than limiting.

As described herein, various embodiments of the invention comprise systems and methods for controlling fluid flow in an immersion lithography system. The fluid flows from a source through a fluid retention hood and then a flow control valve. A pressure drop across the fluid retention hood is measured, and the control valve is adjusted to drive the pressure drop across the fluid retention hood to a desired setpoint, which corresponds to a desired fluid flow rate.

In one embodiment, a flow control mechanism is implemented in an immersion lithography system. The immersion lithography system includes a fluid retention hood that is positioned near the last lens of the system's optics and the semiconductor wafer that is to be exposed by the system. The fluid retention hood is designed to retain a fluid (e.g., water) that fills the gap between the last lens and the wafer. The fluid has an index of refraction which is greater than 1 (the refractive index of air) so the use of the fluid increases the numerical aperture of the system in comparison to lithography systems that use an air gap between the last lens and the wafer. The increased numerical aperture increases the resolution of the system, enabling it to use smaller features in the exposure patterns, or to improve process latitude.

Because the index of refraction of the fluid changes with various factors, it is important to control these factors in order to maintain the improved resolution that is the primary benefit of immersion lithography. For example, since changes in temperature affect the refractive index of the fluid, it is necessary to maintain a flow of the fluid through the gap between the last lens and the wafer to prevent heating of the fluid by the light that is used to expose the wafer. The present systems and methods control the flow of the fluid by supplying the fluid to the fluid retention hood at a positive pressure and adjusting a valve that is downstream from the hood to control the flow of fluid through the hood. The fluid experiences a pressure drop across the fluid retention hood corresponding to the rate at which the fluid is flowing through the hood. The valve is therefore adjusted based on a measured pressure drop across the fluid retention hood.

The various embodiments of the invention may provide a number of advantages over conventional immersion lithography systems. For instance, because the flow control valve is positioned downstream from the fluid retention hood, the vibrations that are typically induced by movement in the upstream flow control valves may be reduced. Additionally, the downstream placement of the control valve and associated control systems move a source of heat (the control system electronics, which are typically near the valve) away from the fluid flowing into the fluid retention hood, so temperature variations of the fluid flowing into the hood may be reduced.

Further, there are advantages arising from the elimination of the vacuum pump that is conventionally used to remove the fluid from the retention hood. For instance, eliminating the vacuum pump eliminates vibrations that can degrade the system's resolution. It also eliminates pulsations in the vacuum that cause flow rate variations. It also eliminates the cost of this expensive component of the system. Still further, the positive fluid pressure at the fluid retention hood helps to prevent the introduction of gas bubbles in the fluid, and allows the fluid to drain from the system at atmospheric pressure (where in conventional systems, the vacuum system had to be stopped to allow the fluid to be removed).

The invention will now be described with reference to specific exemplary embodiments. It should be noted that these embodiments are intended to be illustrative of the invention and the various features that may be included in different embodiments. The following discussion should therefore be broadly construed in accordance with the claims that follow.

Figure 1:
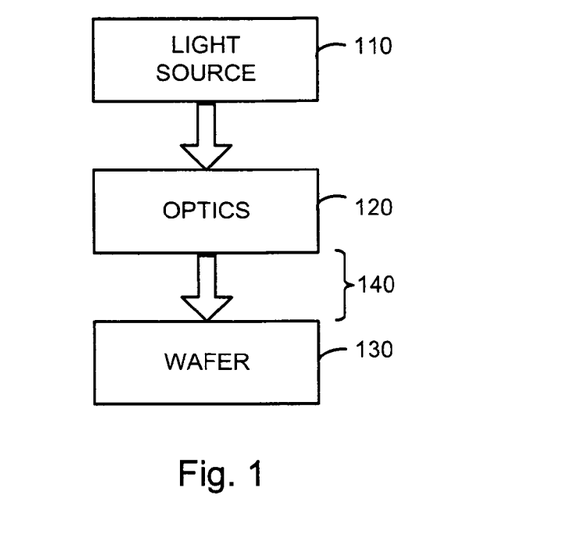
FIG. 1 is a functional block diagram illustrating a lithography system in accordance with one embodiment.

Referring now to FIG. 1, a functional block diagram illustrating a lithography system in accordance with one embodiment is shown. As depicted in the figure, the lithography system includes a light source 110 and a set of optics 120. Reference number 140 is used to indicate the gap between the last lens of optics 120 and semiconductor wafer 130. Conventionally, this is an air gap, but in an immersion lithography system, the gap is filled by a fluid, such as water.

Light produced by source 110 is processed by optics 120, and the resultant illumination is used to expose semiconductor wafer 130. Light source 110 may be any light source suitable for use in the lithography system, and typically will depend upon the type of lithography for which the system is designed. Similarly, the optical processing performed by optics 120 will depend upon the intended use of the system. For example, some lithography systems are designed for use with masks. In this case, it may be desirable to produce even illumination across the extent of a mask so that there is even exposure of all areas that are not covered by the mask. Other systems may be designed to perform maskless lithography, in which case light source 110 and optics 120 will typically be configured to produce a narrowly focused beam that is manipulated to expose individual pixels of the desired pattern in turn. In the case of either of these different types of lithography systems, fluid can be used to increase the Index of refraction in gap 140 and thereby increase the resolution of the pattern which is imaged onto the photoresist on the surface of wafer 130 through exposure by the lithography system.

Figure 2:
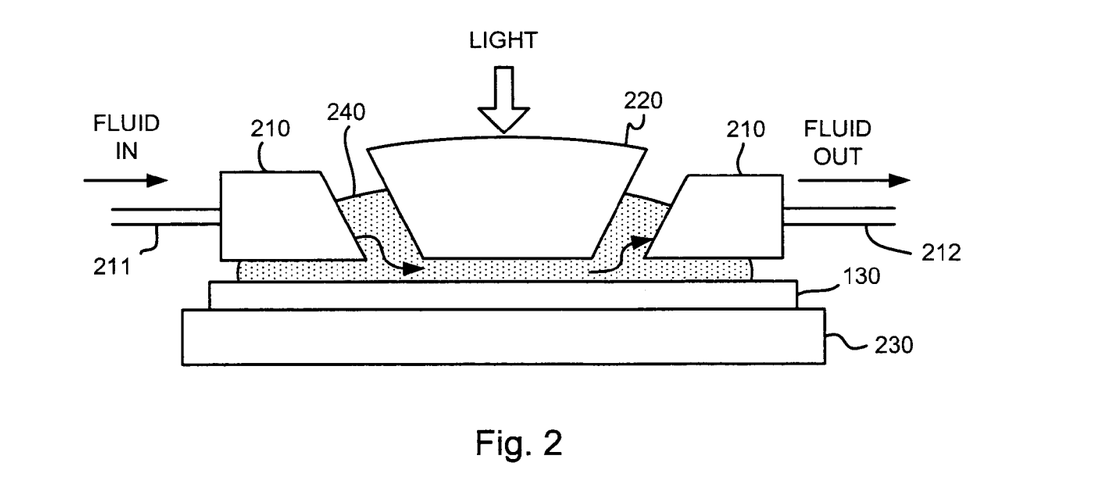
FIG. 2 is a diagram illustrating the use of fluid in an immersion lithography system.

Referring to FIG. 2, a diagram illustrating the use of fluid in an immersion lithography system is shown. In this figure, only the last lens (220) of the lithography system's optics is shown. Light from the preceding optical components in the system passes through lens 220 and through a gap filled with fluid 240, and is focused onto the surface of wafer 130, which is supported by a movable stage 230. Fluid 240 may be any fluid suitable for use in an immersion lithography system, but typically is water.

Fluid 240 is retained in the gap between lens 220 and wafer 130 by a fluid retention hood 210. (It should be noted that fluid retention hood 210 comprises a single component in this embodiment, but appears as two parts when shown in cross section as in the figure.) Fluid retention hood 210 does not touch either lens 220 or wafer 130, but instead "floats" in a position which is very close to both. Because of the close positioning of the fluid retention hood to the lens and wafer, fluid 240 is retained in the gap between them.

As noted above, it is necessary to maintain a flow of fluid 240 through the gap between lens 220 and wafer 130 in order to prevent healing of the fluid and the resulting change in the refractive index of the fluid. Fluid retention hood 210 is therefore coupled to an input fluid line 211 and an output fluid line 212. Fluid 240 flows from input line 211 into fluid retention hood 210, which directs the fluid through an input port into the gap between lens 220 and wafer 130. In the present embodiment, the pressure of fluid 240 of flowing into the gap forces fluid out of the gap into an output port in the fluid retention hood. The fluid then flows out of fluid retention hood 210 through fluid output line 212. It should be noted that the design of fluid retention hood 210 may be conventional, and various suitable designs are known in the field of immersion lithography, so the details of the hood will not be described further here.

Figure 3:
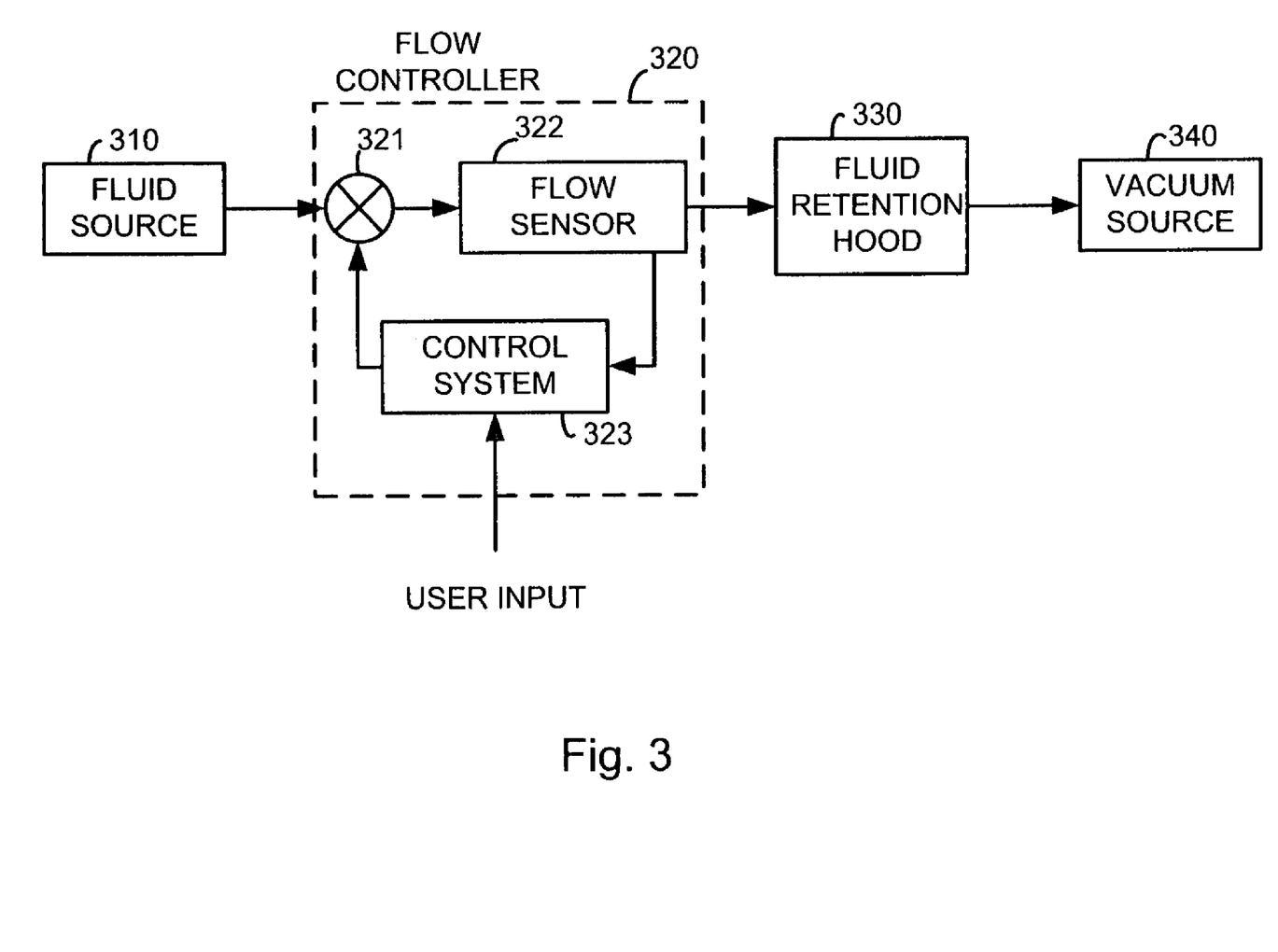
FIG. 3 is a block diagram illustrating the structure of a fluid control system for an immersion lithography system in accordance with the prior art.

Referring to FIG. 3, a block diagram illustrating the structure of a fluid control system for an immersion lithography system in accordance with the prior art is shown. As depicted in this figure, the system includes a fluid source 310, a flow controller 320, a fluid retention hood 330 and a vacuum source 340.

Fluid source 310 may be configured to condition the fluid prior to introducing the fluid into the immersion lithography system. This conditioning may, for example, include removal of particulate matter from the fluid, degassing the fluid and controlling the temperature of the fluid. After the fluid has been conditioned, it is provided by fluid source 310 to flow controller 320.

The second component of the system of FIG. 3 is flow controller 320. Flow controller 320 includes three primary components: a flow control valve 321, a flow sensor 322, and a control system 323. (The flow controller may also include other components that are not explicitly shown in the figure.) The rate at which fluid flows through flow controller 320 is determined by flow control valve 321, which can increase or decrease the flow rate as dictated by control signals received from control system 323. The rate at which the fluid flows through flow controller 320 is sensed by flow sensor 322. Flow sensor 322 provides a signal (or set of signals) indicative of the flow rate to control system 323. Control system 323 determines the sensed flow rate based on the signal(s) received from flow sensor 322 and compares this flow rate to a desired the flow rate. If the actual flow rate is less than the desired flow rate, control system 323 produces control signals for control valve 321 that direct the valve to increase the flow rate of the fluid. Conversely, if the actual flow rate is greater than the desired flow rate, the control signals generated by control system 323 direct control valve 321 to decrease the flow rate of the fluid.

After passing through flow controller 320, the fluid flows to fluid retention hood 330. There, the fluid flows into the gap between the last lens of the lithography system and the semiconductor wafer. Vacuum source 340 is coupled to fluid retention hood 330, and generates a vacuum or reduced pressure which is used to draw the fluid out of the gap between the last lens and the wafer. Vacuum source 340 typically includes a vacuum pump for generating the vacuum, as well as a storage tank for collecting the fluid as it is drawn from fluid retention hood 330.

As pointed out above, prior art systems such as the one described in FIG. 3 have various drawbacks associated with the different components of the system. For instance, flow controller 320 may produce vibrations when control valve 321 is adjusted, and may also cause heating of the fluid because of the proximity to electronic components within the controller. These vibrations and temperature variations may adversely affect the performance of the lithography system. Vacuum source 340 may also produce vibrations that affect the performance of the system, as well as causing pressure pulsations that affect the accuracy of the flow control. Further, operation of the system may have to be interrupted so that fluid can be emptied from the collection tank.

Figure 4:
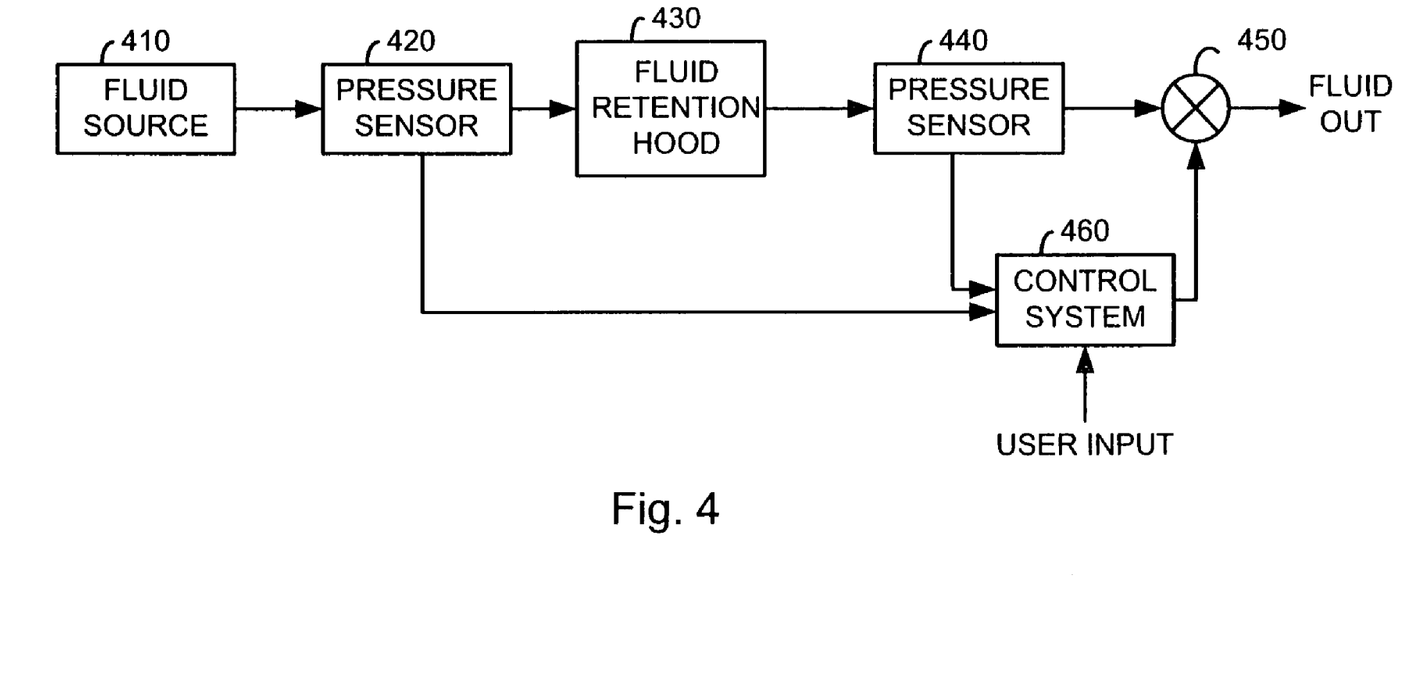
FIG. 4 is a functional block diagram illustrating a flow control mechanism for an immersion lithography system in accordance with one embodiment of the invention.

Referring now to FIG. 4, a functional block diagram illustrating a flow control mechanism for an immersion lithography system in accordance with one embodiment of the invention is shown. In this embodiment, the system has a fluid flow path which originates at fluid source 410, passes through fluid retention hood 430, and then passes through flow control valve 450. After the fluid passes through flow control valve 450, it is allowed to drain out of the system.

In this embodiment, fluid source 410 provides the fluid at a positive pressure. This may be accomplished through various mechanisms, such as pumping the fluid with a hydraulic pump, pneumatically pressurizing a tank holding the fluid, or simply providing a gravity feed for the fluid. It is contemplated that a simple gravity feed mechanism will provide sufficient pressure, without causing any unwanted vibrations that could degrade performance of the system. The output of flow control valve 450, the other hand, is maintained at atmospheric pressure. The pressure differential between fluid source 410 and the atmospheric pressure at the output of flow control valve 450 causes the fluid to flow through the system without the need for a vacuum pump to draw the fluid out of the fluid retention hood. By eliminating the vacuum pump, the system eliminates a source of vibration, a source of the flow variations, and a costly component of prior systems. Additionally, because the fluid drains from the system at atmospheric pressure, there is no need to periodically interrupt operation of the system to remove fluid from the collection tank of the vacuum source.

Because of the pressure gradient along the flow path from source 410 to the output of control valve 450, fluid flows through fluid retention hood 430, which forms part of the flow path. Fluid received from fluid source 410 flows through fluid retention hood 430, and into the gap between the last lens of the lithography optics and the semiconductor wafer. The pressure drop across the fluid retention hood causes the fluid to flow through and out of the gap. The fluid then flows out of fluid retention hood 430, and to control valve 450. The greater the pressure gradient along the flow path, the greater the flow rate of the fluid along this path.

Because there is a pressure gradient through fluid retention hood 430, it is possible to measure a pressure differential, or pressure drop, between the input to the hood and the output from the hood. This pressure drop across the fluid retention hood 430 is correlated to the flow rate of the fluid through the hood and can thus be used as the basis for controlling the flow rate of the fluid (by adjusting flow control valve 450.) The correlation between pressure drop and flow rate can be done on the basis of a calibration routine (e.g., through test runs to determine the correlation between pressure and flow rate) or other mechanism through which the correlation between pressure drop and flow rate is determined for flow controllers. The system therefore includes pressure sensors 420 and 440 so that the pressure drop across fluid retention hood 430 can be measured. Pressure sensors 420 and 440 can be capacitance-type sensors, piezoelectric-type sensors, transducer-type sensors, or any other type of sensor known in the art. The portions of pressure sensors 420 and 440 which are exposed to the fluid in the flow path are preferably chemically inert with respect to the fluid used in the system.

Upstream pressure sensor 420 senses the pressure of the fluid at the inlet of fluid retention hood 430 and sends corresponding signals to control system 460. Downstream pressure sensor 440 similarly senses the pressure of the fluid at the outlet of fluid retention hood 430 and sends corresponding signals to control system 460. Control system 460 then uses the signals to determine the difference between the pressures upstream and downstream of fluid retention hood 430. Control system 460 compares this pressure difference to a desired pressure difference (which corresponds to a desired flow rate) and adjusts flow control valve 450 to drive the sensed pressure drop to the desired value.

Control system 460 may include a data processor (e.g., a digital signal processor, or DSP) and various electronic circuitry for processing the signals received from pressure sensors 420 and 440 and generating control signals for flow control valve 450. Control system 460 may also include program memory or other means for storing program instructions for the data processor, setpoint information used by the control system and other data. Either control system 460 or flow control valve 450 may include drive means to receive control signals and actuate the flow control valve in response to the control signals.

Figure 5:
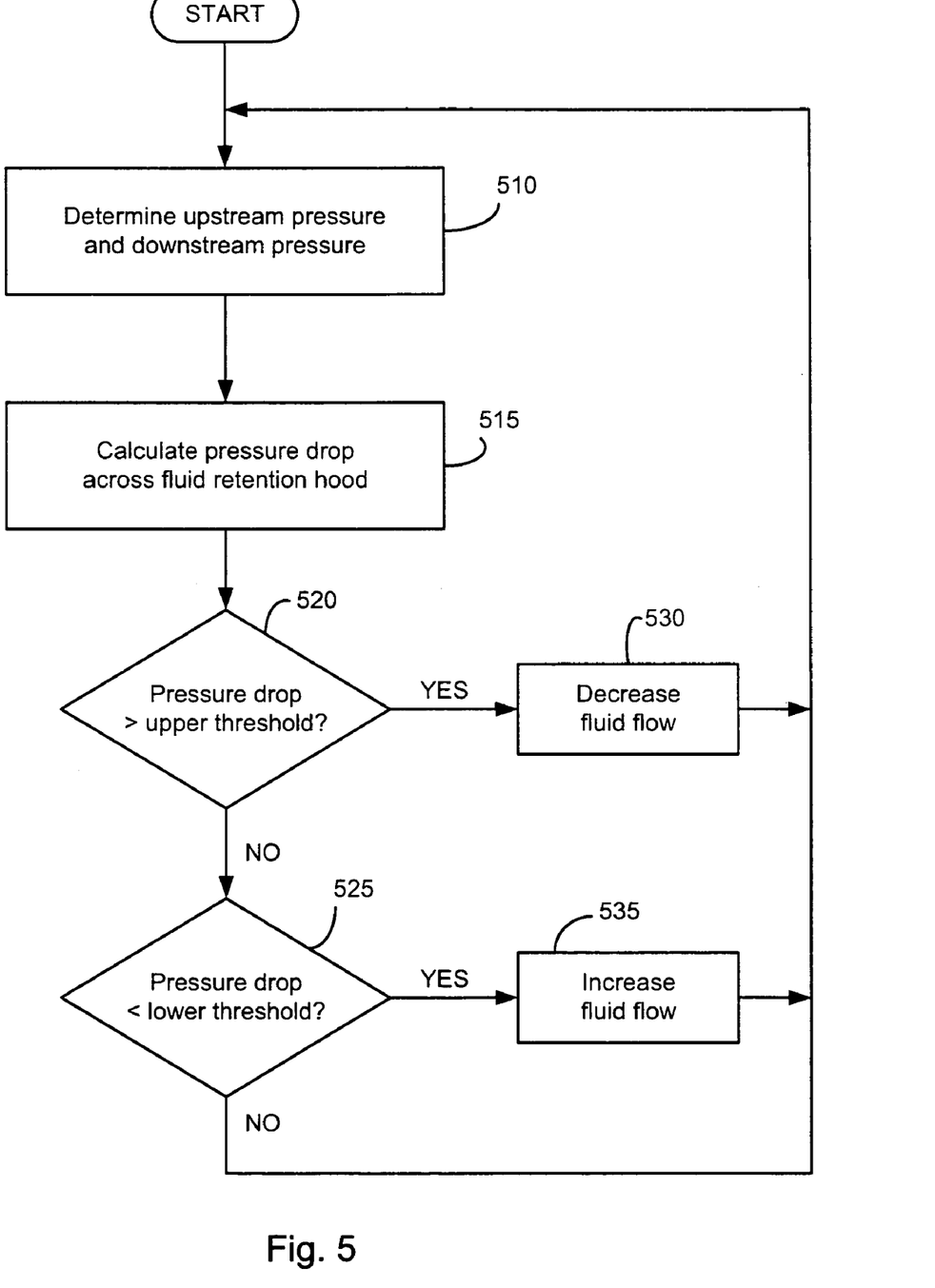
FIG. 5 is a flow diagram illustrating the manner in which fluid flow is controlled in accordance with one embodiment.

Referring to FIG. 5, a flow diagram illustrating the manner in which fluid flow is controlled in accordance with one embodiment is shown. The method depicted in this figure could, for example, be implemented in a system of the type described in connection with FIG. 4. The method of FIG. 5 could also be implemented as a set of program instructions in a data processor (e.g., DSP) of the control system (460,) and such a software program is considered an alternative embodiment of the invention.

Initially, the system determines an upstream pressure and a downstream pressure (block 510.) The upstream pressure is measured by the pressure sensor positioned at the inlet of the fluid retention hood, while the downstream pressure is measured by the pressure sensor positioned at the outlet of the fluid retention hood. The system then calculates the pressure drop across the fluid retention hood, which is simply the difference between the upstream and downstream pressures (block 515.) The pressure drop across the fluid retention hood is then compared to an upper threshold (block 520) to determine whether the fluid flow rate is too high. If so, the system decreases the fluid flow (block 530) by appropriately setting the flow control valve. If, at block 520, the system determines that the pressure drop across the fluid retention hood is not greater than the upper threshold, it then compares the pressure drop to a lower threshold (block 525) to determine whether the fluid flow rate is too low. If the pressure drop across the fluid retention hood is less than the lower threshold, the system increases the fluid flow (block 535) by appropriately setting the flow control valve.

The method illustrated in FIG. 5 attempts to maintain the measured pressure drop across the fluid retention hood between an upper threshold and a lower threshold which are set by a user. It may be possible in various embodiments for a user to modify either or both of these thresholds before or during operation of the system. Alternative embodiments of the system may also implement other algorithms for controlling the fluid flow rate. For example, rather than having upper and lower thresholds, one embodiment might use a single setpoint. The measured pressure drop across the fluid retention hood could be compared to this setpoint and an error term could be generated. The flow control valve could then be adjusted based upon the sign and magnitude of the error term. In other words, the adjustment of flow control valve would be proportional to the error term. In this embodiment, it might be useful to provide a calibration mechanism for the system in order to determine a proportionality constant which would be multiplied by the error term to produce an adjustment value for the flow control valve.

It should be noted that references to measurement of the pressure of the fluid are not intended to imply that it is necessary to convert signals from the pressure sensors into pressure values. The control system may be configured to receive signals from the pressure sensors that are representative of the pressures, but are not actually pressure values. Likewise, the control system may operate on these signals (e.g., compare the signals to corresponding setpoint values) without converting the signals, setpoints or the like to pressures or other physical values. References to fluid pressure measurements, comparisons, etc. should therefore be construed to include determinations of signal values or other representations of the corresponding physical values.

There may be a number of alternative embodiments which have features that vary somewhat from the embodiments described above. For example, in one alternative embodiment, rather than having a pair of pressure sensors (one upstream and one downstream from the fluid retention hood) the system has a single pressure sensor. In this embodiment, the fluid source is maintained at a first pressure, and it is assumed that the fluid is received at the fluid retention hood at this same pressure. Then, it is only necessary to determine the downstream pressure at the outlet of the fluid retention hood. Based upon the known pressure at the fluid source and the sensed pressure at the outlet of the fluid retention hood, that control system can determine the pressure drop across the hood. Then, the control system can generate control signals for the flow control valve in the same manner as for embodiments described above.

It should be noted that various components of the foregoing embodiments have not been described in detail because these components are of essentially the same type and configuration as used in prior art systems. For example, the conditioning of the fluid and pressurization of the fluid at the fluid source are known in the field of fluid flow control. The construction and configuration of flow control valves are also well known. Similarly, the general structure and configuration of control systems for flow control valves are known. Despite the use of these known components, the particular arrangement and operation of the components, as described above, is believed to be distinctive of the prior art.

"Media readable by a data processor," as used herein, refers to any medium that can store program instructions that can be executed by a data processor (e.g., DSP, microprocessor, computer, etc.) and includes floppy disks, hard disk drives, CD-ROMs, DVD-ROMs, RAM, ROM, DASD arrays, magnetic tapes, floppy diskettes, optical storage devices and the like. "Computer", as used herein, is intended to include any type of data processing system capable of reading the media and/or performing the functions described herein.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, software (including firmware) or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the electronic circuits disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system for controlling fluid flow in an immersion lithography unit having a fluid retention hood and a fluid flow path therethrough, the system comprising:
   a pressure sensing unit configured to sense one or more pressures in the fluid flow path and to generate one or more signals indicative of a pressure drop in the fluid flow path across the fluid retention hood;
   a flow control valve positioned in the fluid flow path downstream from the fluid retention hood; and
   a controller coupled to the pressure sensing unit and the flow control valve, wherein the controller is configured to receive the one or more signals from the pressure sensing unit and control the flow control valve to adjust the flow of fluid therethrough and thereby drive the pressure drop across the fluid retention hood to a desired pressure drop.

2. The system of claim 1, wherein the pressure sensing unit comprises a first pressure sensor positioned upstream from the fluid retention hood and a second pressure sensor positioned downstream from the fluid retention hood and wherein the pressure drop in the fluid flow path across the fluid retention hood is indicated by a difference between the pressures sensed by the first and second pressure sensors.

3. The system of claim 1, wherein the pressure sensing unit comprises a single pressure sensor positioned upstream from the fluid retention hood and wherein the pressure drop in the fluid flow path across the fluid retention hood is indicated by a difference between the pressure measured by the single pressure sensor and atmospheric pressure.

4. The system of claim 1, wherein the pressure drop in the fluid flow path across the fluid retention hood is represented in the controller by a pressure drop signal and wherein the controller is configured to drive the pressure drop in the fluid flow path across the fluid retention hood to a desired pressure drop by adjusting the valve to cause the pressure drop signal to approach a target value.

5. The system of claim 1, wherein the controller is configured to drive the pressure drop in the fluid flow path across the fluid retention hood to a desired pressure drop by increasing fluid flow through the valve in response to determining that the pressure drop in the fluid flow path across the fluid retention hood is less than the desired pressure drop and decreasing fluid flow through the valve in response to determining that the pressure drop in the fluid flow path across the fluid retention hood is greater than the desired pressure drop.

6. The system of claim 1, further comprising a pressured fluid source coupled to an upstream end of the fluid flow path.

7. The system of claim 6, wherein a downstream end of the fluid flow path is maintained at atmospheric pressure.

8. A method for controlling fluid flow in an immersion lithography unit having a fluid retention hood and a fluid flow path therethrough, the system comprising:
  sensing a pressure drop in the fluid flow path across the fluid retention hood;
  determining whether the sensed pressure drop is equal to a desired pressure drop; and
  controlling a flow control valve positioned in the fluid flow path downstream from the fluid retention hood to drive the sensed pressure drop to the desired pressure drop.

9. The method of claim 8, wherein sensing the pressure drop in the fluid flow path across the fluid retention hood comprises sensing a first pressure upstream from the fluid retention hood and a second pressure downstream from the fluid retention hood, wherein the pressure drop in the fluid flow path across the fluid retention hood comprises a difference between the first and second sensed pressures.

10. The method of claim 8, wherein sensing the pressure drop in the fluid flow path across the fluid retention hood comprises sensing a pressure downstream from the fluid retention hood, wherein the pressure drop in the fluid flow path across the fluid retention hood comprises a difference between the sensed pressure and a known pressure at a fluid source.

11. The method of claim 8, wherein the pressure drop in the fluid flow path across the fluid retention hood is represented in the controller by a pressure drop signal and wherein controlling the flow control valve to drive the sensed pressure drop to the desired pressure drop comprises adjusting the flow control valve to increase the fluid flow when the pressure drop signal is less than a setpoint signal and adjusting the flow control valve to decrease the fluid flow when the pressure drop signal is greater than the setpoint signal.

12. The method of claim 8, wherein the pressure drop in the fluid flow path across the fluid retention hood is represented in the controller by a pressure drop signal and wherein controlling the flow control valve to drive the sensed pressure drop to the desired pressure drop comprises adjusting the flow control valve to increase the fluid flow when the pressure drop signal is less than a lower threshold signal and adjusting the flow control valve to decrease the fluid flow when the pressure drop signal is greater than an upper threshold signal.

13. The method of claim 8, further comprising maintaining a fluid source at an upstream end of the fluid flow path at a pressure greater than atmospheric pressure.

14. The method of claim 13, further comprising maintaining a drain at a downstream end of the fluid flow path at atmospheric pressure.

15. A software program product comprising a storage medium readable by a data processor in a flow control system that contains one or more instructions configured to cause the data processor to perform the method comprising:
  determining a pressure drop in a fluid flow path across a fluid retention hood;
  determining whether the sensed pressure drop is equal to a desired pressure drop; and
  generating control signals for a flow control valve positioned in the fluid flow path downstream from the fluid retention hood to drive the pressure drop across the fluid retention hood to the desired pressure drop.

16. The software program product of claim 15, wherein determining the pressure drop across the fluid retention hood comprises determining a first pressure upstream from the fluid retention hood and a second pressure downstream from the fluid retention hood, and calculating the pressure drop across the fluid retention hood as a difference between the first and second pressures.

17. The software program product of claim 15, wherein determining the pressure drop across the fluid retention hood comprises determining a pressure downstream from the fluid retention hood, and calculating the pressure drop across the fluid retention hood as a difference between the downstream pressure and a known fluid source pressure.

18. The software program product of claim 15, generating control signals for a flow control valve comprises generating control signals to increase the fluid flow in the flow control valve when the pressure drop across the fluid retention hood is less than a setpoint value and generating control signals to decrease the fluid flow in the flow control valve when the pressure drop across the fluid retention hood is greater than the setpoint value.

19. The software program product of claim 15, generating control signals for a flow control valve comprises generating control signals to increase the fluid flow in the flow control valve when the pressure drop across the fluid retention hood is less than a lower threshold value and generating control signals to decrease the fluid flow in the flow control valve when the pressure drop across the fluid retention hood is greater than an upper threshold value.

\* \* \* \* \*